United States Patent [19]

Okuyama et al.

[11] Patent Number: 5,375,134
[45] Date of Patent: Dec. 20, 1994

[54] SEMICONDUCTOR LIGHT EMITTING DEVICE

[75] Inventors: Hiroyuki Okuyama; Katsuhiro Akimoto, both of Kanagawa, Japan

[73] Assignee: Sony Corporation, Tokyo, Japan

[21] Appl. No.: 232,410

[22] Filed: Apr. 25, 1994

Related U.S. Application Data

[63] Continuation of Ser. No. 983,329, Nov. 30, 1992, abandoned, which is a continuation-in-part of Ser. No. 838,925, Feb. 21, 1992, Pat. No. 5,268,918.

[30] Foreign Application Priority Data

Feb. 21, 1991 [JP] Japan ................... 3-027484
Mar. 18, 1991 [JP] Japan ................... 3-052553
Feb. 19, 1992 [JP] Japan ................... 4-032253

[51] Int. Cl.$^5$ ................................. H01S 3/19
[52] U.S. Cl. ........................... 372/45; 372/46; 257/13
[58] Field of Search ............... 372/45, 46; 257/13

[56] References Cited

U.S. PATENT DOCUMENTS

| | | | |
|---|---|---|---|
| 4,794,606 | 12/1988 | Kondow et al. | 372/45 |
| 4,955,031 | 9/1990 | Jain | 372/45 |
| 4,992,837 | 2/1991 | Sakai et al. | 372/45 |
| 5,008,891 | 4/1991 | Morita | 372/45 |
| 5,010,376 | 4/1991 | Nishimura et al. | 372/45 |
| 5,045,897 | 9/1991 | Ahlgren | 372/45 |
| 5,081,632 | 1/1992 | Migita et al. | 372/45 |
| 5,268,918 | 12/1993 | Akimoto et al. | 372/45 |

FOREIGN PATENT DOCUMENTS

| | | | |
|---|---|---|---|
| 0356059A2 | 2/1990 | European Pat. Off. | H01L 21/38 |
| 0288088 | 11/1988 | Japan | 372/45 |
| 1-169985 | 7/1989 | Japan | H01S 3/18 |
| 2-20086 | 1/1990 | Japan | H01S 3/18 |
| 2-196485 | 8/1990 | Japan | H01S 3/18 |

OTHER PUBLICATIONS

Patent Abstracts of Japan, Publication No. JP1169985, published Jul. 5, 1989; Hideshi Kubota et al "Semiconductor Laser".

Journal of Crystal Growth 117, 1992 (There is no month, just a year–Journal), Hiroyuki Okuyama et al, "Epitaxial Growth of ZnMgSSe on GaAs Substrate by Molecular Beam Epitaxy", pp. 139-143.

Journal of Crystal Growth 131, 1993, (There is no month, just a year–Journal) A. Waag et al, "Growth of MgTe and $Cd_{1-x}Mg_xTe$ Thin Films by Molecular Beam Epitaxy", pp. 607-611 (There is no month; just a year–Journal).

Electronics Letters, Sep. 10, 1992, vol. 28, No. 19, "ZnSe/ZnMgSSe Blue Laser Diode", H. Okuyama et al; pp. 1798-1799.

Japanese Journal of Applied Physics, vol. 30, No. 8, Aug., 1991, pp. 1668-1669; "On the Properties of $ZnSe/(NH_4)_2S_x$-Pretreated GaAs Heterointerfaces", Takahiro Ohnakado et al.

Japanese Journal of Applied Physics, vol. 30, No. 9B, Sep., 1991, pp. L 1620-L 1623; "Epitaxial Growth of ZnMgSSe on GaAs Substrate by Molecular Beam Epitaxy", Hiroyuki Okuyama et al.

Primary Examiner—Georgia Y. Epps
Attorney, Agent, or Firm—Hill, Steadman & Simpson

[57] ABSTRACT

A semiconductor laser has a first cladding layer of a first conductivity type, an active layer, and a second cladding layer of a second conductivity type, which are successively deposited on a semiconductor substrate by epitaxial growth. The first cladding layer and/or the second cladding layer is made of a compound semiconductor material of a zincblende crystal structure containing Mg.

10 Claims, 7 Drawing Sheets

SEMICONDUCTOR LIGHT EMITTING DEVICE

This is a continuation of application Ser. No. 07/983,329, filed Nov. 30, 1992, now abandoned, which is a continuation-in-part of U.S. Ser. No. 07/838,925, filed Feb. 21, 1992, now U.S. Pat. No. 5,268,918.

BACKGROUND OF THE INVENTION

1. Field of the Invention

The present invention relates to a light emitting device such as semiconductor laser, particularly a II–VI compound semiconductor laser, for short-wavelength emission, e.g., blue or ultraviolet laser emission.

2. Description of the Prior Art

There is a growing demand for semiconductor lasers which emit blue or ultraviolet radiation to meet requirements for high packing density and high resolution in the recording of data on and reproduction of data from optical disks and magneto-optic disks.

Semiconductor lasers for blue or ultraviolet emission are required to be made of a material having a large direct transition band gap Eg. Particularly, double-heterojunction semiconductor lasers are required to have a cladding layer made of a material having a greater band gap than the material of an active layer.

Semiconductor lasers have substrates on which various semiconductor layers are deposited by way of epitaxial growth. Such substrates should preferably be of a monocrystalline material of GaAS or GaP that is widely used in various compound semiconductor devices, and is highly crystalline, can be produced at a high rate, is available easily, and inexpensive.

Heretofore, II–VI compound semiconductor materials, especially IIb–VI compound Semiconductor materials or their mixed crystals, are promising as optical device materials because they are of a direct transition band structure.

IIa–VI compounds having a large indirect transition band gap Eg as fluorescent materials are also attracting attention. However, the IIa–VI compounds are unstable as they are hydrolyzed in air, and have unknown basic properties.

Therefore, it is considered advantageous to construct optical devices of IIb–VI compounds. However, it is difficult to select materials having different band gaps from a range of IIb–VI compounds and even their mixed crystals for active and cladding layers.

Figure 1:
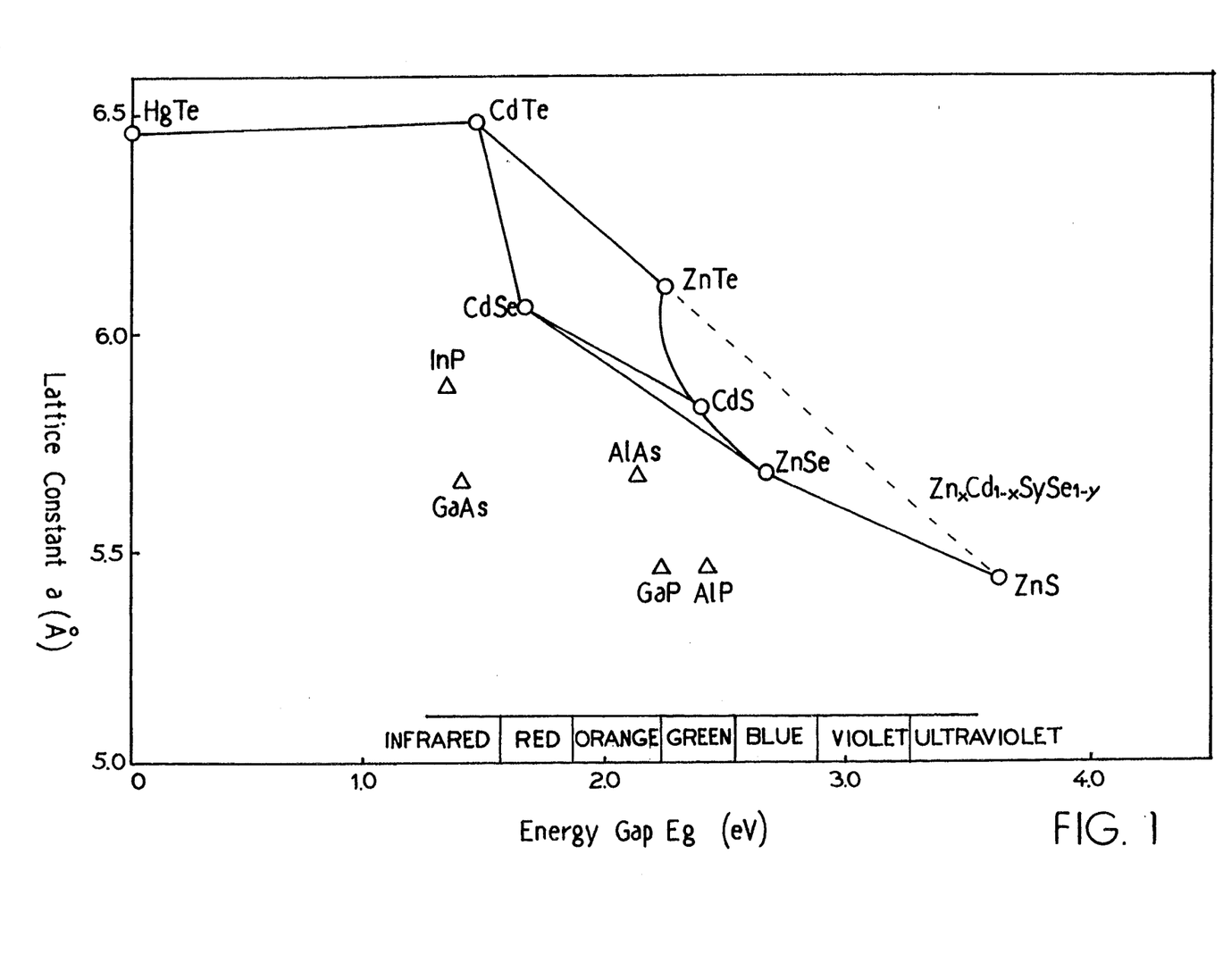
FIG. 1 is a diagram showing the relationship between the lattice constants and band gaps of typical compound semiconductor materials.

FIG. 1 of the accompanying drawings shows the relationship between the lattice constants and band gaps Eg of typical compound semiconductor materials. Since mixed crystals of IIb–VI compounds have large bowing parameters, difficulty has been experienced in combining materials which have large band gaps while achieving lattice matching relatively to each other.

Presently proposed semiconductor materials for emission in the blue wavelength range are ZnSe for an active layer and a superlattice of ZnSSe and ZnSe for a cladding layer, and ZnCdS for an active layer and ZnSSe for a cladding layer. These materials are however problematic in that the difference between the band gaps of the active and cladding layers is 100 meV or less, preventing the cladding layer from properly performing its function, i.e., optical and carrier confinement.

Japanese laid-open patent publication No. 1-169985 discloses a blue semiconductor laser comprising a substrate of GaAs, an active layer of $ZnSe_xS_{1-x}$, and a cladding layer of $Zn_xMg_{-x}Te$. Japanese laid-open patent publication No. 63-233576 discloses a p-n-junction light-emitting device. The disclosed materials are based on MgTe, MgSe, and MgS crystals which have heretofore,been known as fluorescent materials. The MgSe, and MgS crystals are of an NaCl or hexagonal crystalline structure. It is impossible to grow these MgSe, and MgS crystals on a substrate of GaAs, ZnSe, or GaP which is of a zincblende structure.

For the above reasons, there have not been put to practical use any double-heterostructure semiconductor lasers having a band gap $Eg \geq 2.7$ eV, and there have not been developed any semiconductor lasers having a substrate of GaAs, ZnSe, or GaP and capable of continuous excitation at room temperature.

OBJECTS AND SUMMARY OF THE INVENTION

It is an object of the present invention to provide a double-heterojunction semiconductor light emitting device such as a laser which has a compound substrate of GaAs, ZnSe, or GaP and is capable of emitting radiation highly efficiently in a short wavelength.

An active layer of ZnSSe, ZnCdS, or ZnSe having a band gap Eg of 2.7 eV or higher is lattice-matched to a compound semiconductor substrate of GaAs, ZnSe, or GaP for producing a laser emission at a wavelength shorter than that of a blue emission, and a compound $Zn_xMg_{1-x}S_ySe_{1-y}$, which is a mixed crystal of elements in the IIa–VI and IIb–VI groups, is capable of producing a band gap difference that is high enough for the active layer to perform its function of optical and carrier confinement. These materials are used to construct a double-heterojunction semiconductor laser or light-emitting diode for producing a short-wavelength emission.

Furthermore, in order to construct p-type and n-type cladding layers of different II–VI compound semiconductors, i.e., in order to construct an n-type cladding layer of a II–VI compound semiconductor that tends to be of the n-type and also to construct a p-type cladding layer of a II–VI compound semiconductor that tends to be of the p-type, part of the II-group element of the p-type compound semiconductor is composed of a compound semiconductor containing Be which has a small tetrahedral covalent bond radius. In this manner, the p-type cladding layer is reliably produced.

According to the present invention, a double-heterojunction semiconductor laser has a first cladding layer of a first conductivity type, an active layer, and a second cladding layer of a second conductivity type, which are successively deposited on a semiconductor substrate by epitaxial growth.

The first and second cladding layers are made of a compound semiconductor of ZnMgSSe, ZnMgS, or ZnMgSe.

The substrate is made of GaAs, or ZnSe having a lattice constant close to that of GaAs, or GaP.

If the substrate is made of GaAs or ZnSe, the first and second cladding layers have a composition $Zn_xMg_{1-x}S_ySe_{1-y}$ where x, y are an atomic ratio and selected in the ranges of:

$0.3 \leq x < 1.0$, $0 \leq y \leq 1.0$.

According to the present invention, furthermore, a semiconductor laser has a first cladding layer, an active layer, and a second cladding layer, which are successively deposited on a substrate of GaAs by epitaxial growth. One of the first and second cladding layers, which is of the n-type, is made of a compound semiconductor of ZnMgSSe, and the other cladding layer, which is of the p-type, is made of BeZnSTe or BeZnSeTe. The p-type cladding layer has a composition $Be_aZn_{1-a}S_bTe_{1-b}$ or $Be_aZn_{1-a}Se_bTe_{1-b}$ where a, b are an atomic ratio and selected in the ranges of:

$0.1 \leq a \leq 0.7$, $0.5 \leq b \leq 0.9$.

In the case where the substrate is made of GaP, the first and second cladding layers have a composition $Zn_xMg_{1-x}S_ySe_{1-y}$ where x, y are an atomic ratio and selected in the ranges of:

$0.5 \leq x < 1.0$, $0.4 \leq y < 1.0$.

One of the first and second cladding layers, which is of the n-type, is made of a compound semiconductor of ZnMgSSe, and the other cladding layer, which is of the p-type, is made of BeZnSTe or BeZnSeTe. The p-type cladding layer has a composition $Be_aZn_{1-a}S_bTe_{1-b}$ or $Be_aZn_{1-a}Se_bTe_{1-b}$ where a, b are an atomic ratio and selected in the ranges of:

$0.1 \leq a \leq 0.8$, $0.2 \leq b \leq 0.9$.

The value x is less than 1, and a mixed crystal of elements in the IIa-VI and IIb-VI groups, the element in the IIa-VI group containing Mg in the IIa group. Actually, therefore, Mg may have anatomic density of $1 \times 10^{19}$ (atoms/cm$^3$) or more.

As described above, the cladding layers are made of ZnMgSSe which is a mixed crystal of elements in the IIb-VI and IIa-VI groups. Since Mg has a large covalent bond radius though its atomic number is smaller than Zn, Cd, the compound ZnMgSSe can be lattice-matched to GaAs, ZnSe, or GaP and have a large band gap.

Furthermore, inasmuch as part of the II-group element of the p-type cladding layer is composed of a compound semiconductor containing Be which has a small tetrahedral covalent bond radius, Be is most liable to escape from the compound during the epitaxial growth. Therefore, the cladding layer becomes the p-type stably and reliably in the fabrication process.

Measurement of band-end emission peaks in the spectrum of photoluminescence of the compound $Zn_xMg_{1-x}S_ySe_{1-y}$ with different values x, y shows that the band edge emission peaks shift toward a high-energy side when the proportion of Mg increases. However, as the proportion of Mg increases, the surface morphology becomes poor. Nevertheless, it is possible to provide a lattice constant for allowing the compound $Zn_xMg_{1-x}S_ySe_{1-y}$ to lattice-match GaP, or GaAs or ZnSe which has larger lattice constants than GaP, through the selection of the values x, y, and also to increase the band gap up to approximately 4 eV.

It has been confirmed that the compound ZnMgSSe in the above composition range is stable as it is not hydrolyzed when left at room temperature for 3 to 4 months.

Even if the band gap Eg of the active layer of the double-heterojunction semiconductor laser is 2.7 eV or higher, the cladding layers have a sufficiently high band gap Eg which exceeds the band gap Eg of the active layer by at least 100 meV and also have a composition that allows itself to be well lattice-matched to the substrate of GaAs, ZnSe, or GaP. Therefore, the cladding layers are highly crystalline and can reliably perform their function. That is, the short-wavelength semiconductor laser according to the present invention has a high emission efficiency and a low threshold current.

The above and other objects, features, and advantages of the present invention will become apparent from the following description of illustrative embodiments thereof to be read in conjunction with the accompanying drawings, in which like reference numerals represent the same or similar objects.

DETAILED DESCRIPTION OF THE PREFERRED EMBODIMENTS

Figure 2:
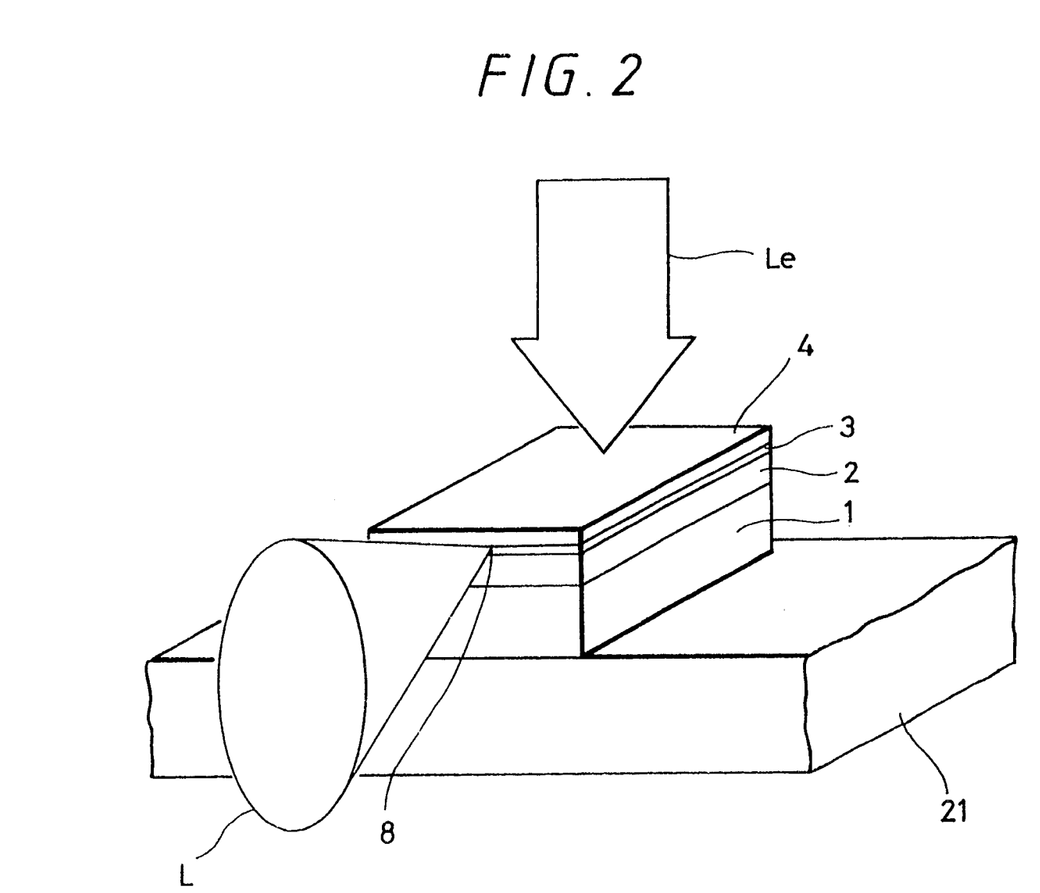
FIG. 2 is a fragmentary perspective view of a semiconductor laser according to an embodiment of the present invention.

As shown in FIG. 2, a semiconductor laser according to an embodiment of the present invention comprises a substrate 1 of a single crystal of GaAs, ZnSe, or GaP. If necessary, a buffer layer (not shown) is deposited on the substrate 1 by way of epitaxial growth. The semiconductor laser also includes a first cladding layer 2 of the p-type or n-type, an active layer 3 of the p-type, n-type, or intrinsic i-type which has a sufficiently low impurity concentration, and a second cladding layer 4 of the n- or p-type. The first cladding layer 2, the active layer 3, and the second cladding layer 4 are successively deposited on the substrate 1 by way of MBE (molecular beam epitaxy) or MOCVD (metal organic chemical vapor deposition).

Figure 3:
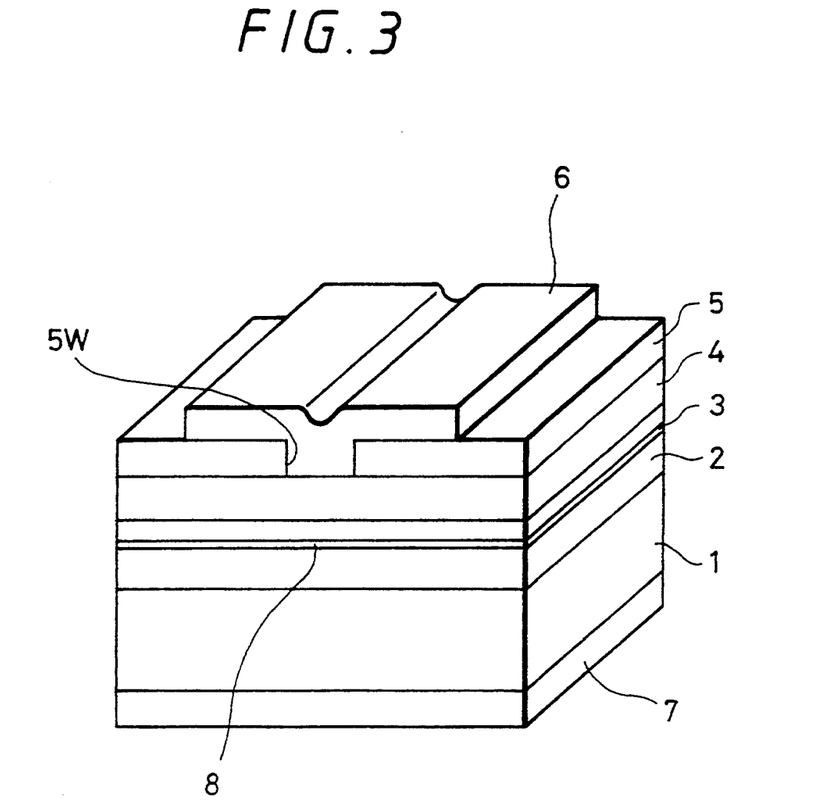
FIG. 3 is a fragmentary perspective view of another semiconductor laser according to another embodiment of the present invention.

FIG. 3 shows a semiconductor laser according to another embodiment of the present invention. The semiconductor laser shown in FIG. 3 is a semiconductor injection laser, and has a substrate 1, a first cladding layer 2, an active layer 3, and a second cladding layer 4, which are identical to those shown in FIG. 2. If necessary, a cap layer (not shown) of the same conductivity type as the second cladding layer 4 is deposited on the second cladding layer 4 by way of epitaxial growth. The semiconductor laser shown in FIG. 3 additionally has an insulating layer 5 as of silicon nitride deposited on the second cladding layer 4 or the cap layer. The insulating layer 5 has a stripe-shaped window 5W defined therein. An electrode 6 is disposed on the insulating layer 5 and electrically connected through the window 5W to the second cladding layer 4 or the cap layer thereon through ohmic contact.

Another electrode 7 is joined to the reverse surface of the substrate 1 through ohmic contact. Alternatively, a heat sink doubling as an electrode may be joined to the reverse surface of the substrate 1 through ohmic contact.

In each of the semiconductor lasers shown in FIGS. 2 and 3, the first and second cladding layers 2, 4 are made of a compound semiconductor of ZnMgSSe, and can be doped with Cl, Ga, or the like into the n-type or with N, O, Na, or the like into the p-type.

In FIGS. 2 and 3, a laser emission end 8 may be defined by a cleavage plane.

Figure 4:
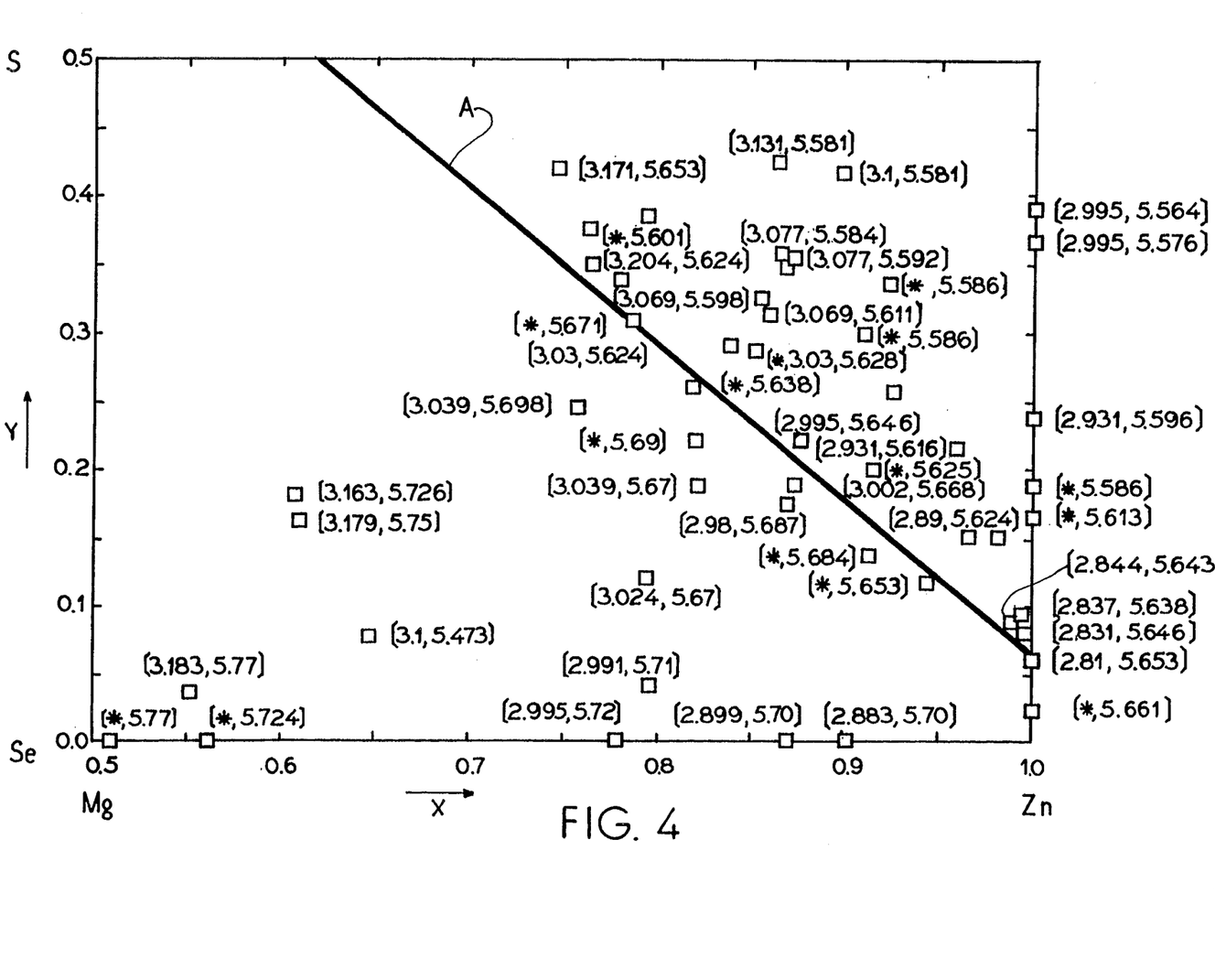
FIG. 4 is a diagram showing the values x, y (atomic or composition ratio) with band gaps and lattice constants.

FIG. 4 shows various values x, y (composition ratio) of the compound $Zn_xMg_{1-x}S_ySe_{1-y}$ which are plotted at different points each accompanied by a band gap Eg (eV) obtained from a band-end emission in the spectrum of photoluminescence of a composition ratio and also by a lattice constant a (Å) obtained from a (400) peak of X-ray diffractometry. The compound ZnMgSSe is lattice-matched to GaAs along a straight line A in FIG. 4.

The straight line A is given by the following equation:

$$y = -1.158x + 1.218.$$

The range of lattice matching which exhibits sufficiently good optical characteristics and is determined in view of the difference between coefficients of thermal expansion between growth temperature and room temperature, is given as follows:

$$-1.158x + 1.118 \leq y \leq -1.158x + 1.318.$$

In FIG. 4, the symbol * indicates no data measured.

Figure 5:
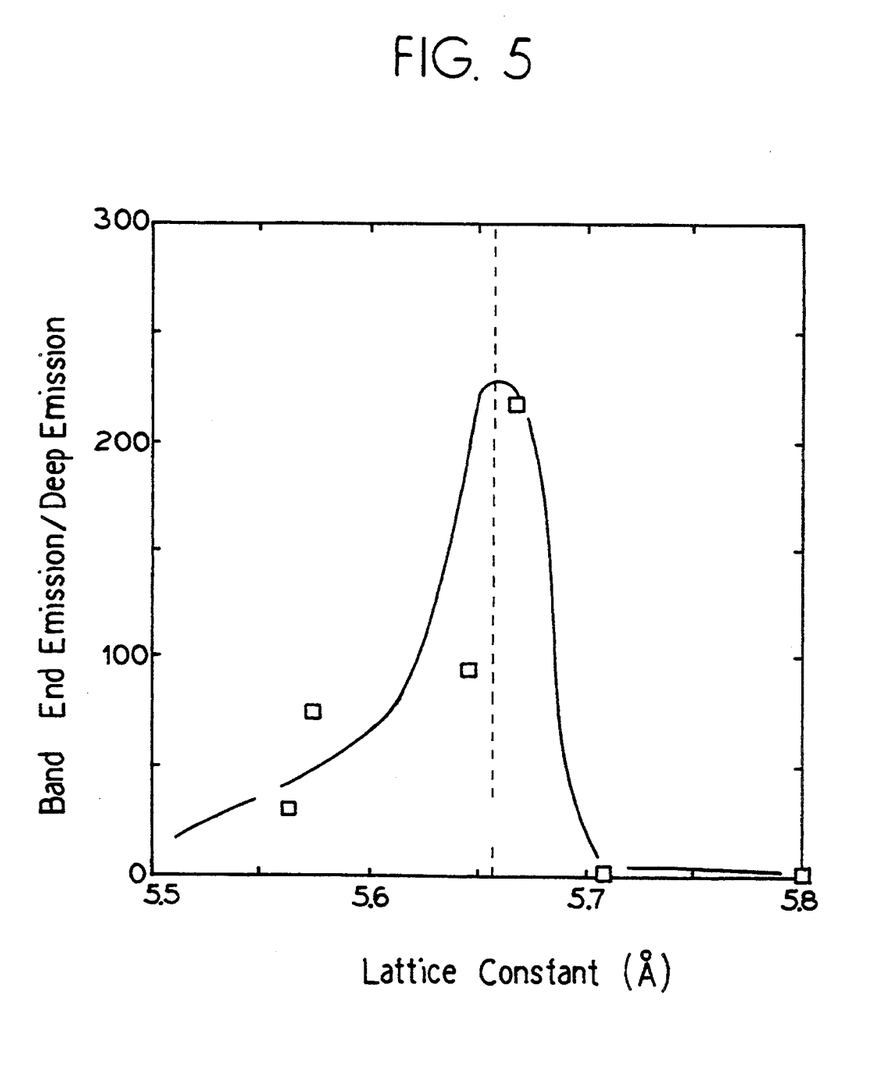
FIG. 5 is a diagram showing the dependency of band-end emission/deep emission on lattice constants.

FIG. 5 shows that the optical characteristics are improved in the range in which the compound ZnMgSSe is lattice-matched to GaAs. The lattice constant of GaAs is 5.653Å. In FIG. 5, using materials having different band gaps Eg ranging from 2.99 to 3.00 eV, band-end emissions ($I_2$)/deep emissions (which reflect the optical characteristics of crystals) were measured with respect to different lattice constants. Study of FIG. 5 indicates that the optical characteristics are best when the lattice constant is close to that of GaAs.

Figure 6:
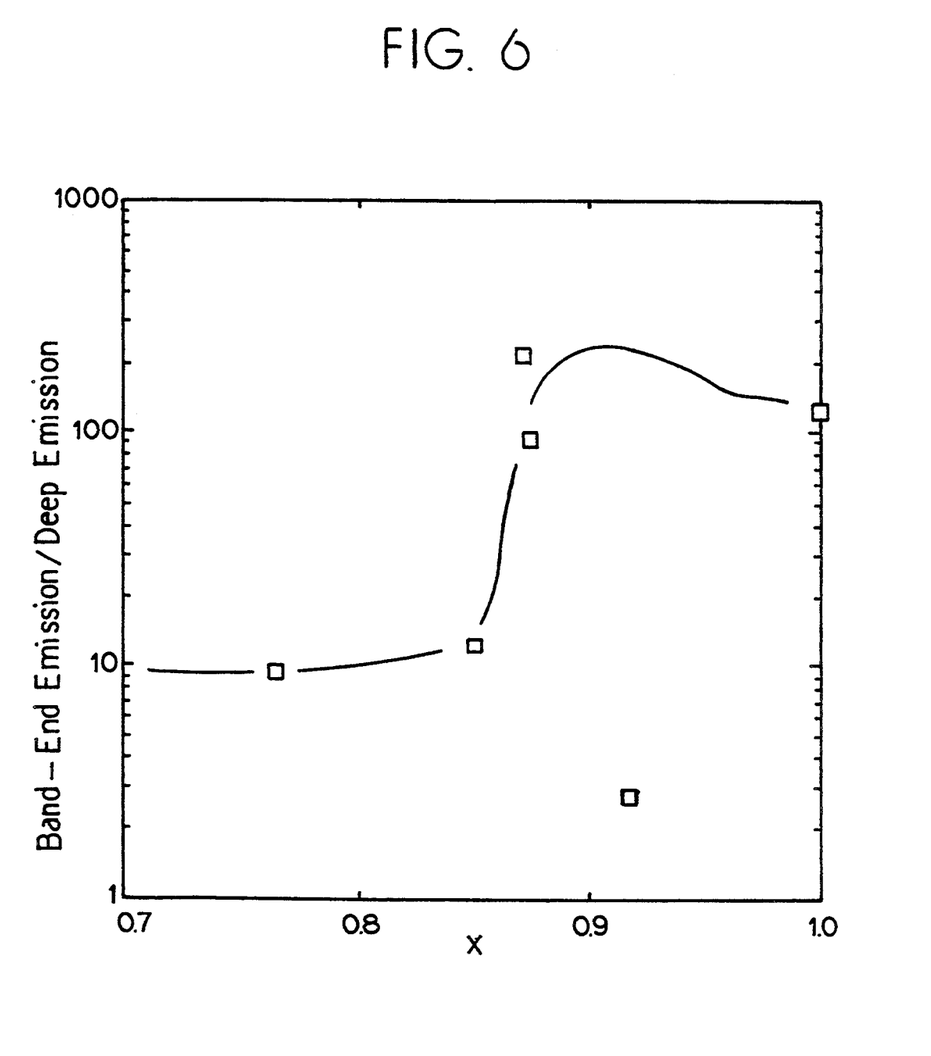
FIG. 6 is a diagram showing the dependency of band-end emission/deep emission on the value x.

FIG. 6 also shows band-end emissions/deep emissions which were measured as the amount of Mg was varied. It can be seen from FIG. 6 that when the substrate of GaAs is used, the value of x should be in the range of:

$$0.85 \leq x < 1.0.$$

EXAMPLE 1

Figure 7:
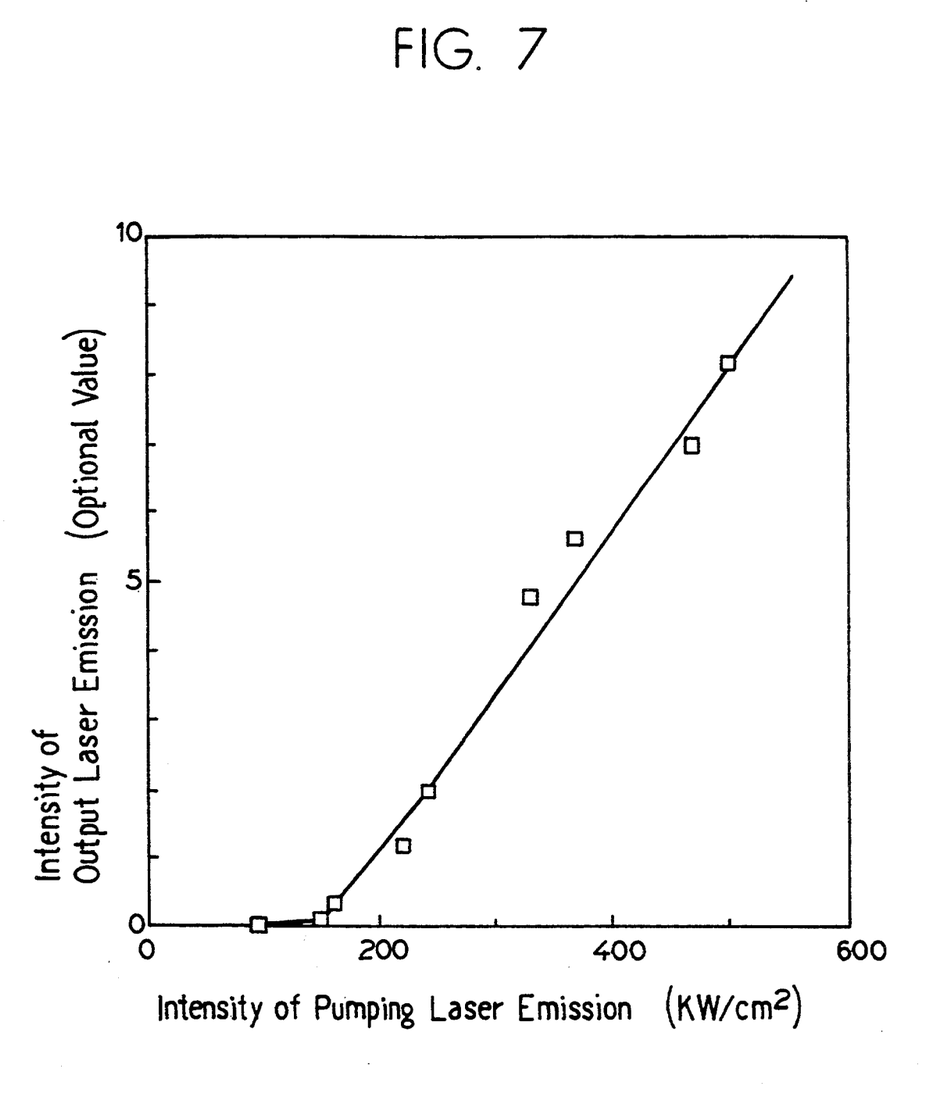
FIG. 7 is a diagram showing the relationship between the intensity of a pumping laser emission and the intensity of an output laser radiation.

In FIG. 2, a substrate 1 of GaAs had a thickness of 100 μm. A first cladding layer 2 of ZnMgSSe having a thickness of 1.5 μm, an active layer 3 of ZnSe having a thickness of 50 μm, and a second cladding layer 4 of ZnMgSSe having a thickness of 150 nm were successively deposited on the substrate 1 by way of MBE, thus producing a semiconductor chip having a length (resonator length) of 400 μm a width of 600 μm. The values x, y of the material of each of the first and second cladding layers 2, 4 were x=0.94 and y=0.17. The semiconductor chip were mounted on a heat sink 21, and an $N_2$ laser emission Le having a wavelength of 337 nm was applied from the side of the second cladding layer 4 to pump the semiconductor chip. As a result, the semiconductor chip emitted a laser radiation L having a wavelength of 470.5 nm from the laser emission end 8. FIG. 7 shows the relationship between the intensity of the pumping laser emission Le and the intensity of the emitted laser radiation L.

EXAMPLE 2

In FIG. 2, the substrate 1 was made of a single crystal of GaAs. Each of the first and second cladding layers 2, 4 was 1 μm thick and made of $Zn_xMg_{1-x}S_ySe_{1-y}$ where x is about 0.8 and y is about 0.3. The active layer 3 was 0.1 μm thick and made of $ZnS_zSe_{1-z}$ where z is about 0.06.

An electron beam was applied from the side of the second cladding layer 4 to pump the semiconductor laser, which then emitted a laser radiation having a wavelength of about 470 nm.

The band-end emission at 4° K. of photoluminescence of the material of the cladding layers 2, 4 in Example 2 was measured. The band end BE was about 3.1 eV. The band end BE of the active layer 3 was about 2.8 eV. The cladding layers 2, 4 and the active layer 3 deposited on the substrate 1 by epitaxial growth were well lattice-matched.

It can be understood that the difference between the band gaps of the cladding layers 2, 4 and the active layer 3 was of a high value of about 300 meV as is apparent from the difference between the band ends BE thereof (the band end BE is slightly smaller than the energy gap).

EXAMPLE 3

A semiconductor chip of the same structure as that of Example 2 was fabricated, and the electrodes 6, 7 shown in FIG. 3 were attached to the semiconductor chip. When a forward voltage was applied between the electrodes 6, 7, a similar laser emission was radiated from the semiconductor chip.

EXAMPLE 4

In FIG. 2, the substrate 1 was made of a single crystal of GaAs. Each of the first and second cladding layers 2, 4 was 1 μm thick and made of $Zn_xMg_{1-x}S_ySe_{1-y}$ where x is about 0.8 and y is about 0.3. The active layer 3 was 0.1 μm thick and made of $Zn_zCd_{1-z}S$ where z is about 0.42.

An electron beam was applied from the side of the second cladding layer 4 to pump the semiconductor laser, which then emitted a laser radiation having a wavelength of about 450 nm.

The band-end emission of photoluminescence of the material of the cladding layers 2, 4 in Example 4 was measured. The band end BE was about 3.1 eV. The band end BE of the active layer 3 was about 2.85 eV. The cladding layers 2, 4 and the active layer 3 deposited on the substrate 1 by epitaxial growth were well lattice-matched.

It can be understood that the difference between the band gaps of the cladding layers 2, 4 and the active layer 3 was slightly less than about 300 meV.

EXAMPLE 5

A semiconductor chip of the same structure as that of Example 4 was fabricated, and the electrodes 6, 7 shown in FIG. 3 were attached to the semiconductor chip. When a forward voltage was applied between the electrodes 6, 7, a similar laser emission was radiated from the semiconductor chip.

In Examples 1, 2, 3, 4, 5, the substrate 1 was made of GaAs. If the substrate 1 was made of GaP, then the cladding layers 2, 4 were well lattice-matched to the substrate 1 and the band gap was large if the values x, y in $Zn_xMg_{1-x}S_ySe_{1-y}$ were selected in the ranges of:

$0.5 \leq x < 1.0$, $0.4 \leq y < 1.0$.

EXAMPLE 6

In FIG. 2, the substrate 1 was made of a single crystal of GaP. Each of the first and second cladding layers 2, 4 was 1 μm thick and made of $Zn_xMg_{1-x}S_ySe_{1-y}$ where x is about 0.85 and y is about 1. The active layer 3 was 0.1 μm thick and made of $ZnS_zSe_{z-1}$ where z is about 0.84.

An electron beam was applied from the side of the second cladding layer 4 to pump the semiconductor laser, which then emitted a laser radiation having a wavelength of about 400 nm.

EXAMPLE 7

A semiconductor chip of the same structure as that of Example 6 was fabricated, and the electrodes 6, 7 shown in FIG. 3 were attached to the semiconductor chip. When a forward voltage was applied between the electrodes 6, 7, a similar laser emission was radiated from the semiconductor chip.

EXAMPLE 8

In FIG. 2, the substrate 1 was made of a single crystal of GaP. Each of the first and second cladding layers 2, 4 was 1 μm thick and made of $Zn_xMg_{1-x}S_ySe_{1-y}$ where x is about 0.85 and y is about 1. The active layer 3 was 0.1 μm thick and made of $Zn_zCd_{1-z}S$ where z is about 0.9.

An electron beam was applied from the side of the second cladding layer 4 to pump the semiconductor laser, which then emitted a laser radiation having a wavelength of about 400 nm.

EXAMPLE 9

A semiconductor chip of the same structure as that of Example 8 was fabricated, and the electrodes 6, 7 shown in FIG. 3 were attached to the semiconductor chip. When a forward voltage was applied between the electrodes 6, 7, a similar laser emission was radiated from the semiconductor chip.

EXAMPLE 10

In FIG. 2, a n-type substrate 1 was made of GaAs. An n-type first cladding layer 2 of ZnMgSSe doped with an impurity of Ga or Cl and having a thickness of about 1 μm, an active layer 3 of ZnSSe having a thickness of 0.1 μm, and a p-type second cladding layer 4 of BeZnSeTe doped with an impurity of N or P were successively deposited on the substrate 1 by way of epitaxial growth, thus fabricating a semiconductor laser.

One electrode (not shown) was attached to the reverse side of the substrate 1, and another electrode is attached in a stripe shape to the second cladding layer 4. The semiconductor laser was pumped by a forward voltage applied between the electrodes or an electron beam applied from the side of the second cladding layer 4. As a result, the semiconductor laser produced a blue emission.

EXAMPLE 11

In FIG. 2, a n-type substrate 1 was made of GaP. An n-type first cladding layer 2 of ZnMgSSe doped with an impurity of Ga or Cl and having a thickness of about 1 μm, an active layer 3 of ZnCdS having a thickness of 0.1 μm, and a p-type second cladding layer 4 of BeZnSSe doped with an impurity of N or P were successively deposited on the substrate 1 by way of epitaxial growth, thus fabricating a semiconductor laser.

Electrodes are attached to the semiconductor laser in the same manner as Example 10. Then, the semiconductor laser was pumped by a forward voltage applied between the electrodes or an electron beam applied from the side of the second cladding layer 4. As a result, the semiconductor laser produced a violet emission.

In Examples 10, 11, the GaAs or GaP substrate may be of the p-type, and the first and second cladding layers 2, 4 may be of the opposite conductivity type. Specifically, the first cladding layer 2 may contain Be, and the second cladding layer 4 may be contain Mg.

The present invention is not limited to the above structures. In addition to or in place of the stripe-shaped electrode, a current constricting region may be formed in each of opposite sides, defining a stripe-shaped resonator centrally in the active layer 3, by introduction from the side of the second cladding layer 4 of an impurity having a conductivity type different from that of the second cladding layer 4 or proton implantation for higher resistance.

With the arrangement of the present invention, as described above, since the substrate 1 of GaAs, ZnSe, or GaP is available easily, can be produced at a high rate, and is inexpensive to fabricate, and the cladding layers 2, 4 are well lattice-matched to the substrate 1 with a large band gap, the semiconductor laser has good emission characteristics such as high emission efficiency, can operate stably at room temperature, and can oscillate continuously for laser emission at short wavelengths.

When the semiconductor laser according to the present invention is used as a light source for recording and reproducing optical information, it allows the information to be recorded with high packing density and reproduced with high resolution, and also permits optical recording and reproducing devices to be manufactured inexpensively.

The semiconductor laser according to the present invention is also effective to reduce the cost of display devices which scan three R, G, B laser beams to display visible images.

Having described preferred embodiments of the invention with reference to the accompanying drawings, it is to be understood that the invention is not limited to that precise embodiments and that various changes and modifications could be effected by one skilled in the art without departing from the spirit or scope of the invention as defined in the appended claims.

What is claimed is:

1. A semiconductor light emitting device, comprising:
   a semiconductor substrate;
   a first cladding layer of a first conductivity type disposed on said semiconductor substrate by epitaxial growth;

an active layer disposed on said first cladding layer by epitaxial growth;

a second cladding layer of a second conductivity type disposed on said active layer by epitaxial growth; and at least one of said first cladding layer and said second cladding layer being made of a compound semiconductor material of a zincblende crystal structure comprising ZnMgSSe.

2. A semiconductor light emitting device according to claim 1 wherein said semiconductor substrate is made of one of the elements selected from the group consisting of GaAs and ZnSe, at least one of said first and second cladding layers having a composition $Zn_xMg_{1-x}S_ySe_{1-y}$ where x, y are an atomic ratio and selected in the ranges of:

$0.3 \leq x < 1.0,$ $0 \leq y < 1.0.$

3. A semiconductor light emitting device according to claim 1 wherein said semiconductor substrate is made of one of the elements selected from the group consisting of GaAs and ZnSe, both of said first and second cladding layers having a composition $Zn_xMg_{1-x}S_ySe_{1-y}$ where x, y are an atomic ratio and selected in the ranges of:

$0.3 \leq x < 1.0,$ $0 \leq y < 1.0.$

4. A semiconductor light emitting device according to claim 2 wherein said first cladding layer is of the n-type and said second cladding layer is of the p-type, said first cladding layer having a composition $Zn_xMg_{1-x}S_ySe_{1-y}$ where x, y are an atomic ratio and selected in the ranges of:

$0.3 \leq x < 1.0,$ $0 \leq y < 1.0,$ and wherein said second cladding layer is made of a semiconductor of one of the elements selected from the group consisting of BeZnSTe and BeZnSeTe.

5. A semiconductor light emitting device according to claim 4 wherein said second cladding layer has a composition of one of the elements selected from the group consisting of $Be_aZn_{1-a}Se_bTe_{1-b}$ where a, b are an atomic ratio and selected in the ranges of:

$0.1 \leq a \leq 0.7,$ $0.5 \leq b \leq 0.9.$

6. A semiconductor light emitting device comprising:
a substrate of GaP;
a first cladding layer of a first conductivity type disposed on said substrate by epitaxial growth;
an active layer disposed on said first cladding layer by epitaxial growth;
a second cladding layer of a second conductivity type disposed on said active layer by epitaxial growth; and
at least one of said first and second cladding layers having a composition $Zn_xMg_{1-x}S_ySe_{1-y}$ where x, y are an atomic ratio and selected in the ranges of:

$0.5 \leq x < 1.0,$ $0.4 \leq y < 1.0.$

7. A semiconductor light emitting device, comprising:
a substrate of GaP;
a first cladding layer of a first conductivity type disposed on said substrate by epitaxial growth;
an active layer disposed on said first cladding layer by epitaxial growth;
a second cladding layer of a second conductivity type disposed on said active layer by epitaxial growth; and
both of said first and second cladding layers having a composition $Zn_xMg_{1-x}S_ySe_{1-y}$ where x, y are an atomic ratio and selected in the ranges of:

$0.5 \leq x < 1.0,$ $0.4 \leq y < 1.0.$

8. A semiconductor light emitting device according to claim 6 wherein said first cladding layer is of the n-type and said second cladding layer is of the p-type, said first cladding layer having a composition $Zn_xMg_{1-x}S_ySe_{1-y}$ where x, y are an atomic ratio and selected in the ranges of:

$0.5 \leq x < 1.0,$ $0.4 \leq y < 1.0,$ and wherein said second cladding layer is made of a semiconductor of one of the elements selected from the group consisting of BeZnSTe and BeZnSeTe.

9. A semiconductor light emitting device according to claim 8 wherein said second cladding layer has a composition of one of the elements selected from the group consisting of $Be_aZn_{1-a}S_bTe_{1-b}$ and $Be_aZn_{1-a}Se_bTe_{1-b}$ where a, b are an atomic ratio and selected in the ranges of:

$0.1 \leq a < 0.8,$ $0.2 \leq b < 0.9.$

10. A semiconductor light emitting device, comprising:
a semiconductor substrate;
a first cladding layer of a first conductivity type on said substrate;
an active layer on said first cladding layer;
a second cladding layer of a second conductivity type on said active layer; and
at least one of said first cladding layer and said second cladding layer being made of a compound semiconductor material of a zincblend crystal containing Mg and being substantially lattice-matched to said substrate.

* * * * *